United States Patent
Cho et al.

(10) Patent No.: US 7,704,779 B2
(45) Date of Patent: Apr. 27, 2010

(54) IMAGE SENSING DEVICE HAVING PROTECTION PATTERN ON THE MICROLENS, CAMERA MODULE, AND METHOD OF FORMING THE SAME

(75) Inventors: Jung-Hyun Cho, Suwon-si (KR); Jong-Woo Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 274 days.

(21) Appl. No.: 11/901,671

(22) Filed: Sep. 18, 2007

(65) Prior Publication Data
US 2008/0203508 A1  Aug. 28, 2008

(30) Foreign Application Priority Data
Feb. 23, 2007  (KR) ............... 10-2007-0018447

(51) Int. Cl.
H01L 21/00 (2006.01)
H01L 31/0232 (2006.01)
(52) U.S. Cl. .......................... 438/69; 257/432
(58) Field of Classification Search ......... 257/432–437, 257/294, E25.032, E33.056–E33.059; 439/69; 438/69–70, 29, 48, 65
See application file for complete search history.

(56) References Cited

U.S. PATENT DOCUMENTS

| | | | |
|---|---|---|---|
| 6,333,458 B1 * | 12/2001 | Forrest et al. ............... 136/259 |
| 7,125,738 B2 * | 10/2006 | Huang et al. .................. 438/48 |
| 7,413,923 B2 * | 8/2008 | Yun ............................. 438/70 |
| 2005/0224694 A1 * | 10/2005 | Yaung ..................... 250/208.1 |
| 2006/0138487 A1 | 6/2006 | Kim |
| 2007/0200056 A1 | 8/2007 | Kim et al. |
| 2008/0042227 A1 * | 2/2008 | Asano et al. ................ 257/432 |

FOREIGN PATENT DOCUMENTS

| | | |
|---|---|---|
| JP | 2001-308300 | 11/2001 |
| KR | 2002-0088547 | 11/2002 |
| KR | 10-2006-0073192 | 6/2006 |
| KR | 10-2006-0091518 | 8/2006 |
| KR | 10-2007-0089385 | 8/2007 |

* cited by examiner

*Primary Examiner*—Calvin Lee
(74) *Attorney, Agent, or Firm*—Mills & Onello, LLP

(57) ABSTRACT

An image sensing device having a protection pattern formed on microlenses is provided. The device includes a plurality of photodiodes provided in a semiconductor substrate. An insulating layer having a substantially flat top surface is disposed on the photodiodes. A plurality of microlenses are provided on the insulating layer and disposed over the photodiodes. The microlenses are covered with a protection pattern. The protection pattern can be formed of an oxide-based photosensitive polymer layer or a nitride-based photosensitive polymer layer, as examples. The protection pattern can have a substantially flat top surface.

16 Claims, 4 Drawing Sheets

IMAGE SENSING DEVICE HAVING PROTECTION PATTERN ON THE MICROLENS, CAMERA MODULE, AND METHOD OF FORMING THE SAME

CROSS-REFERENCE TO RELATED APPLICATION

This application claims priority under 35 U.S.C. §119 to Korean Patent Application No. 10-2007-0018447, filed Feb. 23, 2007, the disclosure of which is hereby incorporated herein by reference in its entirety.

BACKGROUND OF THE INVENTION

1. Field of the Invention

The present invention relates to an image sensing device and a camera module, and more particularly, to an image sensing device having a protection pattern on a microlens or microlenses, a camera module employing the image sensing device, and a method of forming the same.

2. Description of the Related Art

Camera modules capable of creating still images and moving pictures are widely used in mobile phones, digital cameras, video cameras, and closed circuit TVs. The camera module is composed of an image sensing device and a case. The image sensing device includes a solid-state image sensing device, such as a CMOS image sensor (CIS) or a charge coupled device (CCD). The solid-state image sensing device is a semiconductor device capable of changing an optical image signal from the outside into an electrical signal.

FIG. 1 is a cross-sectional view of a conventional CMOS image sensor, or CIS.

Referring to FIG. 1, an isolation layer 13 defining active regions 12 is provided in a semiconductor substrate 11. Photodiodes 17 are provided in the active regions 12. Each of the photodiodes 17 includes an n-type impurity region 16 and a p-type impurity region 15, which are sequentially stacked in the active region 12. The semiconductor substrate 11 having the photodiodes 17 is covered with a lower insulating layer 19.

Interconnections 21 and a bond pad 23 are disposed on the lower insulating layer 19. The interconnections 21 can be electrically connected to the photodiodes 17. The interconnections 21 are disposed so they do not hide the photodiodes 17. An upper insulating layer 25 covering the interconnections 21 is provided. The upper insulating layer 25 includes a pad window 25W exposing the bond pad 23. Color filters 27 are disposed in the upper insulating layer 25. A plurality of microlenses 29 are disposed on the upper insulating layer 25.

Light passing through the microlenses 29 is transformed into an electrical signal in the photodiode 17 via the color filters 27. The microlenses 29 function to maximize an amount of light reaching the photodiodes 17. That is, each of the microlenses 29 serves as a condenser lens.

However, each of the microlenses 29 has a generally hemispherical convex surface. Accordingly, a top surface of each of the microlenses 29 is not flat. As a result, contaminants such as particles P are easily adhered to the top surface of the microlenses 29. However, the adhered particles P are very difficult to remove due to the uneven structure. Furthermore, the microlenses 29 are exposed to physical damage, such as scratches.

The particles P and the physical damage block and alter the light passing through the microlenses 29.

Meanwhile, the formation of the pad window 25W includes processes of forming a photoresist pattern (not illustrated) covering the microlenses 29, etching the upper insulating layer 25 until the bond pad 23 is exposed, and removing the photoresist pattern. The removal of the photoresist pattern can be performed by known ashing and cleaning processes.

Here, the non-flat or bumpy top surface of the microlenses 29 makes complete removal of the photoresist pattern difficult. That is, the removal of the photoresist pattern requires a complicated cleaning process, which leads to deterioration of production efficiency.

Also, another image sensor having a microlens and a method of forming the same are disclosed in Japanese Patent. Publication No. 2001-308300 entitled "Solid-State Image Element and Its Manufacturing Method" by Hiroki.

According to Hiroki, a solid-state image sensing device having several microlenses and a method of forming the same are provided. The microlenses are arranged at short intervals, but not immediately adjacent to one another as in FIG. 1. In such a case, complicated techniques for preventing physical damage of the microlenses and surface adhesion of contaminants are required in Hiroki.

SUMMARY OF THE INVENTION

In accordance with various aspects of the present invention, provided is an image sensing device, which can substantially prevent physical damage of a microlens and adhesion of contaminants.

Also in accordance with various aspects of the present invention, provided is a camera module including an image sensing device which can substantially prevent physical damage of a microlens and adhesion of contaminants.

Also in accordance with various aspects of the present invention, provided is a method of forming an image sensing device that can substantially prevent physical damage of a microlens and adhesion of contaminants.

In one aspect, there is provided an image sensing device including a plurality of photodiodes disposed in a semiconductor substrate. At least one insulating layer with a substantially flat top surface is disposed on the photodiodes. A plurality of microlenses are provided on the insulating layer, each microlens disposed over a corresponding one of the photodiodes. The microlenses are covered with a protection pattern.

The protection pattern can have a substantially flat top surface.

The protection pattern can be formed of an oxide-based photosensitive polymer layer or a nitride-based photosensitive polymer layer.

The protection pattern can have a transmittance of about 80% to 99.9%.

A plurality of color filters can be provided within the at least one insulating layer. The color filters can be disposed between the photodiodes and the microlenses.

The device can further comprise interconnections provided in the at least one insulating layer. The interconnections can be disposed to not cover the photodiodes. The interconnections can be electrically connected to the photodiodes.

The at least one insulating layer can include a resin layer.

In another aspect, there is provided a camera module having an image sensing device. The camera module includes a case having a transparent window. A printed circuit board including a plurality of external terminals is mounted in the case. A semiconductor substrate is mounted on the printed circuit board. A plurality of photodiodes are disposed in the semiconductor substrate. A lower insulating layer covering the semiconductor substrate having the photodiodes is provided. An upper insulating layer having a substantially flat top surface is disposed on the lower insulating layer. A plurality of microlenses are disposed on the upper insulating layer and over the photodiodes. The microlenses are covered with a protection pattern. The protection pattern is disposed in the case. The transparent window is arranged over the protection pattern.

The protection pattern can have a substantially flat top surface.

The protection pattern can be formed of an oxide-based photosensitive polymer layer or a nitride-based photosensitive polymer layer.

The protection pattern can have a transmittance of about 80% to 99.9%.

The camera module can further comprise a plurality of color filters in the insulating layer. The color filters can be disposed between the photodiodes and the microlenses.

The printed circuit board can include a bond finger and an internal interconnection. The internal interconnection can be in contact with the bond finger and the plurality of external terminals.

The camera module can further comprise interconnections and a bond pad can be disposed on the lower insulating layer. The interconnections and the bond pad can be disposed to not cover the photodiodes. The interconnections can be electrically connected to the photodiodes. The bond pad can be spaced apart form the interconnections. The bond pad can be electrically connected to the bond finger.

In still another aspect, there is provided a method of forming an image sensing device having a protection pattern on microlenses. The method includes forming a plurality of photodiodes in a semiconductor substrate and forming at least one insulating layer having a substantially flat top surface on the photodiodes. The method also includes forming a plurality of microlenses on the insulating layer, each of the microlenses being arranged over a corresponding one of the photodiodes. And the method includes forming a protection pattern covering the microlenses.

Forming the protection pattern can include forming a protection layer on the semiconductor substrate having the microlenses and patterning the protection layer by exposure and development.

The protection layer can be formed of an oxide-based photosensitive polymer layer or a nitride-based photosensitive polymer layer.

The protection layer can be formed of a material layer having a transmittance of about 80% to 99.9%.

The protection pattern can be formed to have a substantially flat top surface.

Forming the at least one insulating layer can include forming a lower insulating layer on the semiconductor substrate having the photodiodes and forming an upper insulating layer on the lower insulating layer.

The method can further comprise forming interconnections and a bond pad on the lower insulating layer and forming a plurality of color filters within the upper insulating layer.

The method can further comprise etching the upper insulating layer until the bond pad is exposed using the protection pattern as an etch mask.

Forming the upper insulating layer can include forming a resin layer on the lower insulating layer.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the invention.

DETAILED DESCRIPTION OF THE INVENTION

Figure 1:
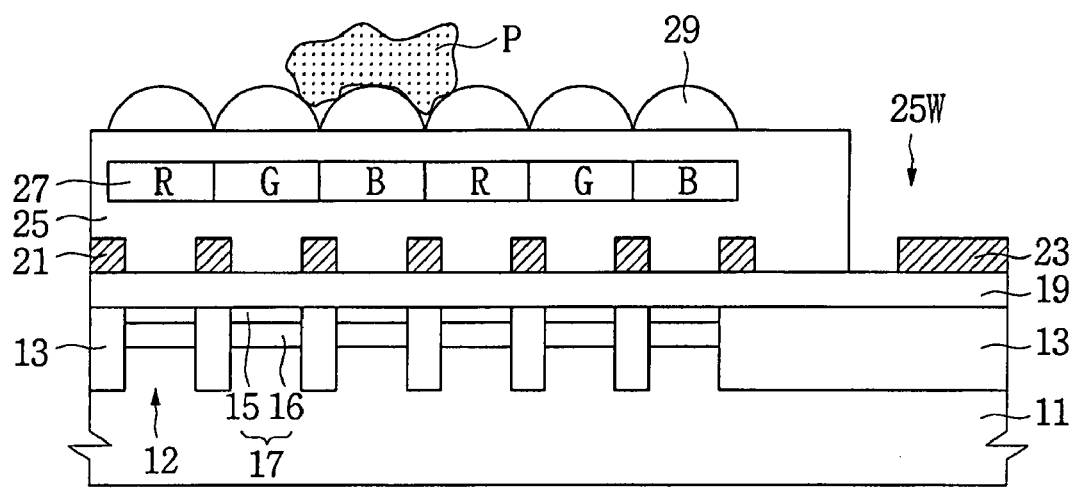
FIG. 1 is a cross-sectional view of a prior art image sensor.

Hereinafter, aspects of the present invention are described by explaining exemplary embodiments in accordance therewith, with reference to the accompanying drawings. This invention can, however, be embodied in different forms and should not be construed as limited to the embodiments set forth herein. In the drawings, the thickness of layers and regions are exaggerated for clarity. In addition, when a layer is described to be formed on another layer or on a substrate, that layer can be formed on the other layer or substrate, or a third layer can be interposed between the layer and the other layer or substrate. Like numbers refer to like elements throughout the specification.

It will be understood that, although the terms first, second, etc. may be used herein to describe various elements, these elements should not be limited by these terms. These terms are used to distinguish one element from another, but not to imply a required sequence of elements. For example, a first element can be termed a second element, and, similarly, a second element can be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

Figure 2:
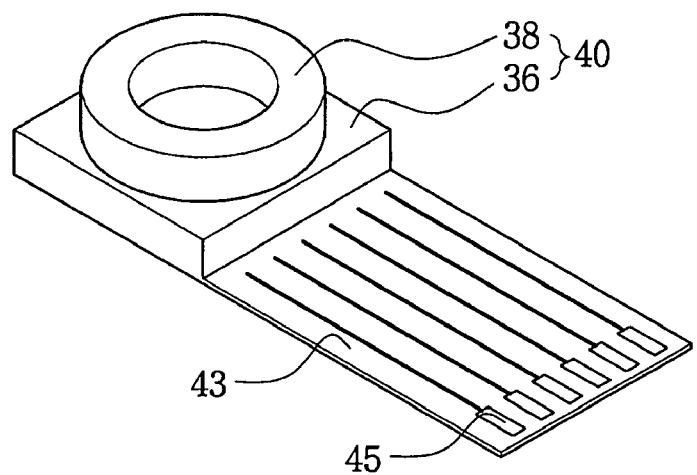
FIG. 2 is a perspective view illustrating an external shape of an embodiment of a camera module according to an aspect of the present invention.
Figure 3:
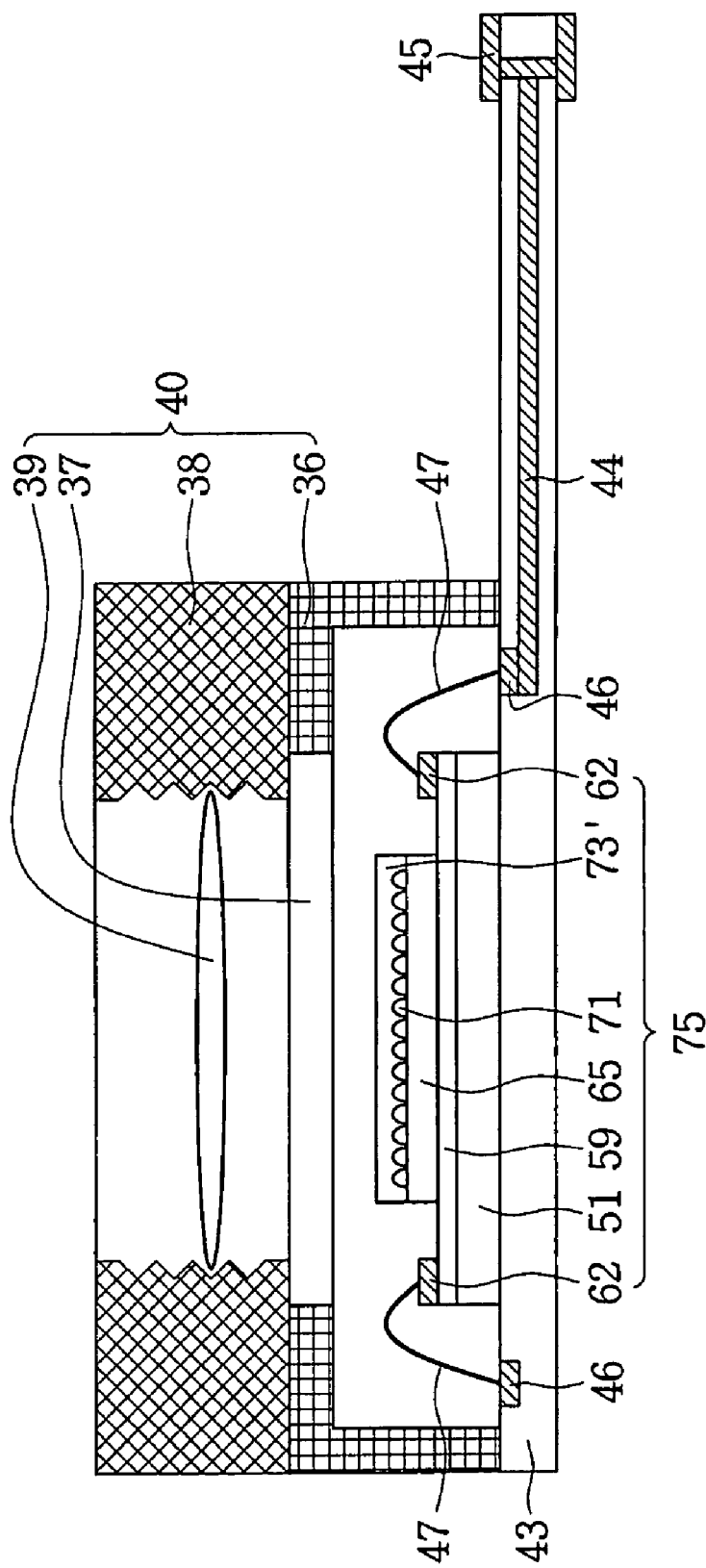
FIG. 3 is a cross-sectional view illustrating the interior of an embodiment of a camera module according to an aspect of the present invention.
Figure 4:
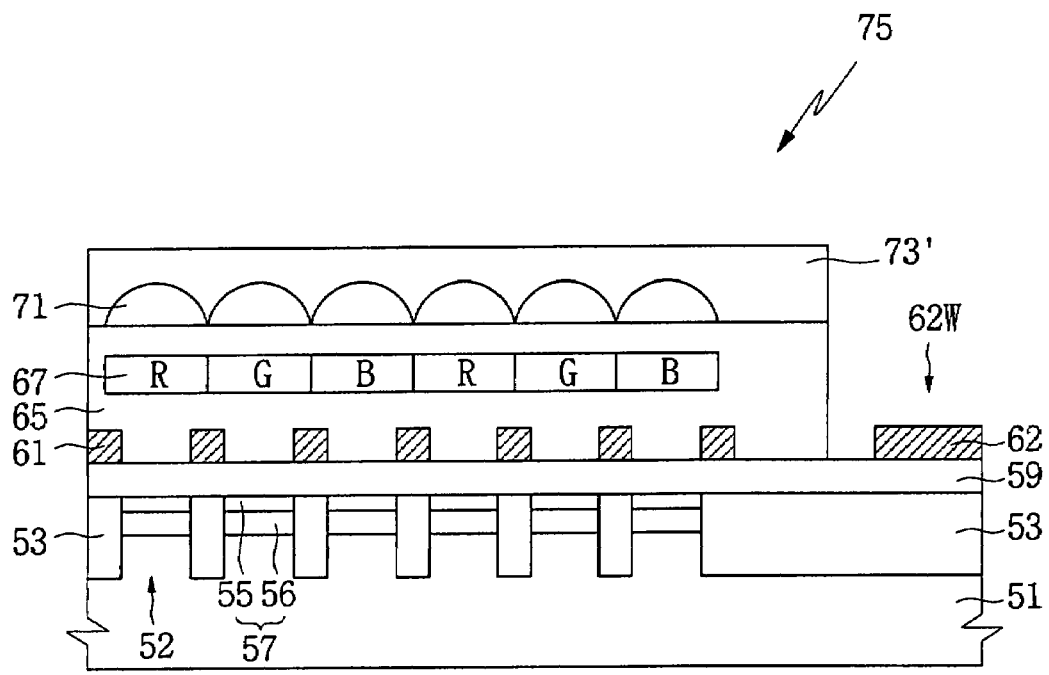
FIG. 4 is a partial cross-sectional view of an embodiment of an image sensing device having a protection pattern formed on microlenses according to an aspect of the present invention.

FIG. 2 is a perspective view illustrating an external shape of an embodiment of a camera module according to an aspect of the present invention, FIG. 3 is a cross-sectional view illustrating the interior of an embodiment of a camera module according to an aspect of the present invention, and FIG. 4 is a partial cross-sectional view of an embodiment of an image sensing device having a protection pattern formed on microlenses according to an aspect of the present invention.

Referring to FIG. 2, the camera module according to the exemplary embodiment can include a case 40 and a printed circuit board 43. The case 40 can be composed of a sensor case 36 and a lens holder 38.

The printed circuit board 43 can be a flexible printed circuit board. External terminals 45 can be provided on one end of the printed circuit board 43. The printed circuit board 43 can be mounted under the sensor case 36. The lens holder 38 can be disposed on the sensor case 36.

Referring to FIG. 3, an image sensing device 75 can be mounted on the printed circuit board 43. The image sensing device 75 can be a solid-state image sensing device, such as a CMOS image sensor (CIS) or a charge coupled device (CCD). Following is a brief description for the case when the image sensing device 75 is a CMOS image sensor (CIS).

The image sensing device 75 can include a lower insulating layer 59, bond pads 62, an upper insulating layer 65, microlenses 71, and a protection pattern 73' disposed on a semiconductor substrate 51. The protection pattern 73' can cover the microlenses 71. The protection pattern 73' can include a flat top surface. The protection pattern 73' can serve to protect the microlenses 71 from physical damage. Also, the protection pattern 73' can serve to prevent contamination on the surface of the microlenses 71.

The printed circuit board 43 can include the external terminals 45, bond fingers 46, and an internal interconnection 44, all of which can be formed of a conductive material. The internal interconnection 44 can be buried in the printed circuit board 43. The external terminals 45 can be disposed on one end of the printed circuit board 43. The bond fingers 46 can be exposed to the surface of the printed circuit board 43. The internal interconnection 44 can be in contact with each of the bond fingers 46 and each external terminal 45. The internal interconnection 44 can serve to electrically connect a particular bond finger 46 with a corresponding external terminal 45.

Each bond pad 62 can be electrically connected to one of the bond fingers 46 by a corresponding one of the bonding wires 47. Each bonding wire 47 can be a conductive wire, such as a gold (Au) wire or an aluminum (Al) wire.

The sensor case 36 can be mounted on the printed circuit board 43. In this case, the image sensing device 75, the bonding wires 47, and the bond fingers 46 can be disposed within the sensor case 36. That is, the image sensing device 75 can be surrounded by the sensor case 36 and the printed circuit board 43.

The sensor case 36 can include a transparent window 37. The transparent window 37 can be arranged over the microlenses 71. The transparent window 37 can include a filter (not illustrated) that can prevent diffusion of light and block harmful rays, such as an infrared ray.

The lens holder 38 can be adhered to the sensor case 36. A lens 39 can be disposed in the lens holder 38. The sensor case 36, the transparent window 37, the lens holder 38, and the lens 39 can comprise the case 40. The transparent window 37 and the lens 39 can be sequentially arranged over the microlenses 71.

As illustrated in FIG. 3, a camera module according to this exemplary embodiment can be a chip on board (COB) module.

Alternatively, the camera module can be implemented using known surface mount technology (SMT). For example, the printed circuit board 43 can be disposed on the image sensing device 75. In this case, each of the bond fingers 46 and its corresponding bond pad 62 can be electrically connected to each other by a conductive bump, such as a solder bump or an Au bump. Also, the printed circuit board 43 can be a ball grid array (BGA) substrate.

The image sensing device 75 can be exposed to physical damage and contaminants during the process of forming the bonding wire 47 or the mounting of the printed circuit board 43 in the sensor case 36. In this case, the protection pattern 73' can serve to prevent damage of the microlenses 71 and contamination of the surfaces of the microlenses 71.

Referring to FIG. 4, the image sensing device 75 can include an isolation layer 53 defining active regions 52 in the semiconductor substrate 51. The semiconductor substrate 51 can be a silicon wafer. The isolation layer 53 can be an insulating layer, such as a silicon oxide layer, a silicon nitride layer, a silicon oxynitride layer, or a combination thereof.

Photodiodes 57 can be provided in the active regions 52. Each photodiode 57 can include an n-type impurity region 56 and a p-type impurity region 55 sequentially stacked in the active region 52. The semiconductor substrate 51 having the photodiodes 57 can be covered with the lower insulating layer 59. The lower insulating layer 59 can include a resin layer, a silicon oxide layer, a silicon nitride layer, a silicon oxynitride layer, or a combination thereof.

Interconnections 61 and the bond pad 62 can be disposed on the lower insulating layer 59; note that only one of the bond pads 62 is shown in the partial cross-sectional view of FIG. 4. The interconnections 61 and the bond pad 62 can be disposed such that they do not cover the photodiodes 57. That is, the interconnections 61 can be disposed such that they do not block light irradiated to the photodiodes 57. The interconnections 61 and the bond pad 62 can be electrically connected to the photodiodes 57.

The interconnections 61 and the bond pad 62 can be formed of a conductive material layer. For example, the interconnections 61 can be a metal layer, a metal silicide layer, a polysilicon layer, or a combination thereof. The bond pad 62 can include a metal layer, such as an Al layer.

The upper insulating layer 65 covering the interconnections 61 can be provided on the lower insulating layer 59. The upper insulating layer 65 can include a pad window 62W exposing the bond pad 62. The upper insulating layer 65 can have a substantially flat top surface. The upper insulating layer 65 can include a resin layer, a silicon oxide layer, a silicon nitride layer, a silicon oxynitride layer, or a combination thereof.

A plurality of color filters 67 can be two-dimensionally arranged in the upper insulating layer 65. The color filters 67 can include red filters R, green filters G, and blue filters B. The color filters 67 can be arranged over the photodiodes 57. That is, each photodiode 57 can be arranged to correspond to one of the color filters 67.

The microlenses 71 can be disposed on the upper insulating layer 65. Each of the microlenses 71 can include a hemispherical convex surface. The microlenses 71 can be arranged over the photodiodes 57. That is, the color filters 67 and the microlenses 71 can be sequentially arranged over the photodiodes 57. The light passing through the microlenses 71 can be collected in the photodiodes 57 through the color filters 67.

The protection pattern 73' covering the microlenses 71 can be provided on the upper insulating layer 65. The protection pattern 73' can be formed of an oxide-based photosensitive polymer layer or a nitride-based photosensitive polymer layer. In this case, the protection pattern 73' can be a material layer having excellent transmittance. For example, the protection pattern 73' can be a material layer having a transmittance ranging from about 80% to 99.9%.

The protection pattern 73' can serve to prevent physical damage of the microlenses 71. The protection pattern 73' can have a substantially flat top surface. Accordingly, the surface of the protection pattern 73' is not generally susceptible to adhesion of contaminants. Even when the contaminants are adhered to the surface of the protection pattern 73', the contaminants can be easily removed therefrom.

Figure 5:
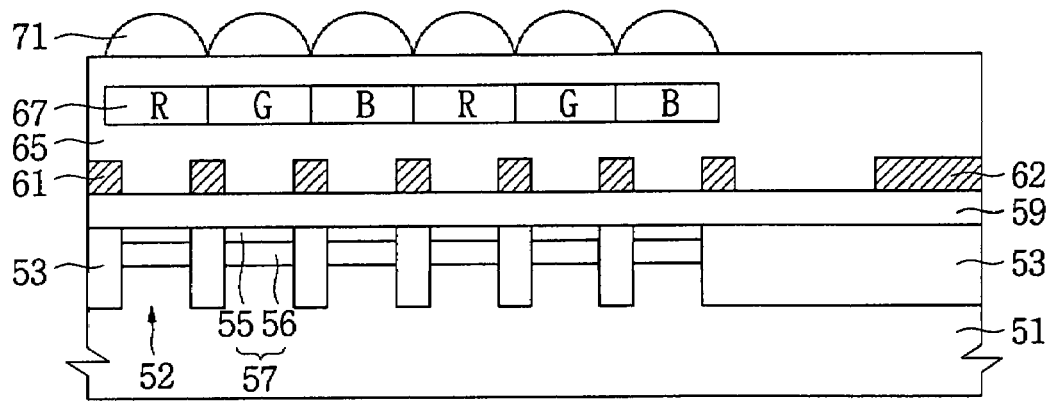
FIGS. 5 to 7 are partial cross-sectional views illustrating an embodiment of a method of forming an image sensing device according to an aspect of the present invention.
Figure 6:
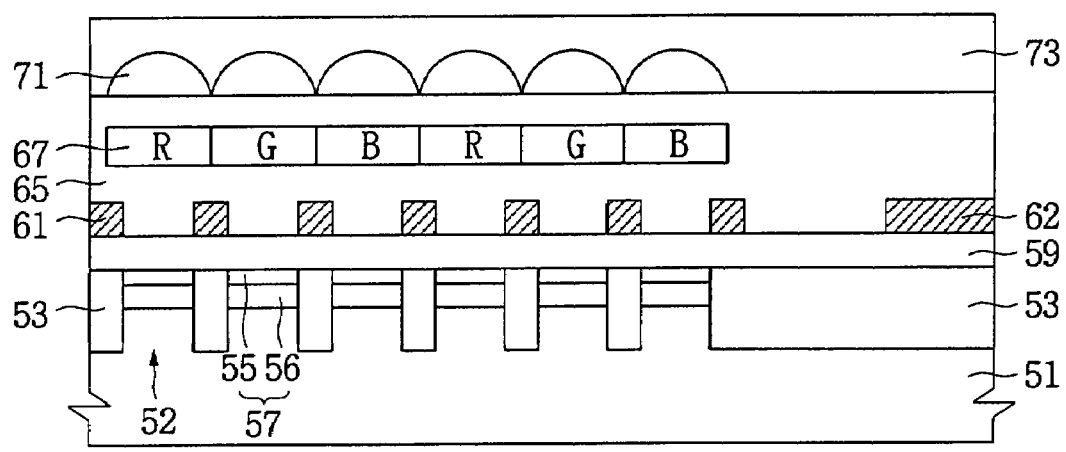
Figure 7:
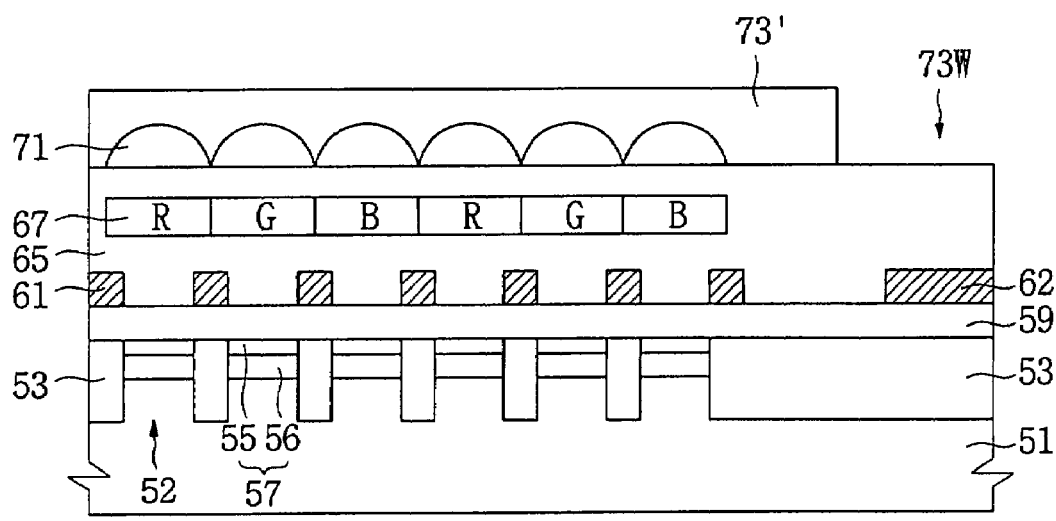

FIGS. 5 to 7 are partial cross-sectional views illustrating an embodiment of a method of forming an image sensing device according to an aspect of the present invention, such as the image sensing device of FIGS. 2 through 4.

Referring to FIG. 5, an isolation layer 53 defining active regions 52 can be formed in the semiconductor substrate 51. The semiconductor substrate 51 can be a single crystal silicon wafer. The isolation layer 53 can be formed by shallow trench isolation (STI) technique. The isolation layer 53 can be an insulating layer, such as a silicon oxide layer, a silicon nitride layer, a silicon oxynitride layer or a combination thereof.

Impurity ions can be injected into the active regions 52 to form n- and p-type impurity regions 56 and 55. The p-type impurity region 55 can be formed on the n-type impurity region 56. That is, the n- and p-type impurity regions 56 and 55 can be sequentially stacked in the semiconductor substrate 51. The p- and n-type impurity regions 55 and 56 can form a photodiode 57. Several photodiodes 57 can be formed in the semiconductor substrate 51.

A lower insulating layer 59 can be formed on the semiconductor substrate 51 having the photodiodes 57. The lower insulating layer 59 can be a resin layer, a silicon oxide layer, a silicon nitride layer, a silicon oxynitride layer or a combination thereof. Other devices, such as a gate electrode of a transmission transistor, can be formed on the semiconductor substrate 51, but it will be omitted herein to simplify the description. The lower insulating layer 59 can be formed to have a substantially flat top surface.

Interconnections 61 and a bond pad 62 can be formed on the lower insulating layer 59. The interconnections 61 and the bond pad 62 can be formed such that they do not cover the photodiodes 57. That is, the interconnections 61 can be formed such that they do not block the light irradiated to the photodiodes 57. The interconnections 61 and the bond pad 62 can be electrically connected to the photodiodes 57.

The interconnections 61 and the bond pad 62 can be formed of a conductive material layer. For example, the interconnections 61 can be formed of a metal layer, a metal silicide layer, a polysilicon layer or a combination thereof. The bond pad 62 can be formed of a metal layer such as an Al layer.

An upper insulating layer 65 covering the interconnections 61 can be formed on the lower insulating layer 59. A plurality of color filters 67 can be formed within the upper insulating layer 65. The upper insulating layer 65 can be formed to have a planarized top surface. The upper insulating layer 65 can be formed of a resin layer, a silicon oxide layer, a silicon nitride layer, a silicon oxynitride layer, or a combination thereof.

The color filters 67 can be two-dimensionally arranged within the upper insulating layer 65. The color filters 67 can include red filters R, green filters G and blue filters B. The color filters 67 can be formed to be arranged over the photodiodes 57. That is, each color filter 67 can be formed to correspond to one of the photodiodes 57.

Microlenses 71 can be formed on the upper insulating layer 65. Each microlens 71 can be formed to have a hemispherical convex surface. The microlenses 71 can be arranged over the photodiodes 57. That is, the color filter 67 and the microlens 71 can be sequentially arranged over the photodiode 57. The light passing through the microlenses 71 can be collected in the photodiodes 57 through the color filters 67.

Referring to FIG. 6, a protection layer 73 can be formed on the semiconductor substrate 51 having the microlenses 71. The protection layer 73 can be formed of an oxide-based photosensitive polymer layer or a nitride-based photosensitive polymer layer. In this case, the protection pattern 73' can be formed of a material layer having excellent transmittance. The protection pattern 73' can be formed of a material layer having a transmittance ranging from about 80% to 99.9%. Furthermore, the protection layer 73 can be formed of a material layer having an etch selectivity with respect to the upper insulating layer 65.

The protection layer 73 can be formed to cover the microlenses 71. The protection layer 73 can be formed by spin-coating or deposition, as examples. The protection layer 73 can be formed to have a planarized top surface.

Referring to FIG. 7, the protection layer 73 can be patterned to form protection pattern 73'. The protection layer 73 can be patterned by known exposure and development processes. The protection pattern 73' can be formed to cover the microlenses 71. In this case, an opening 73W partially exposing the upper insulating layer 65 can be formed over the bond pad 62.

The upper insulating layer 65 can be etched using the protection pattern 73' as an etch mask to form a pad window 62W exposing the bond pad 62, as shown in FIG. 4. As a result, the upper insulating layer 65 can continue to cover the interconnections 61.

The etching of the upper insulating layer 65 can be performed by an isotropic or anisotropic etching process, as examples. In this case, the protection pattern 73' can serve to protect the microlenses 71.

As described above, the protection pattern 73' can be formed of an oxide-based photosensitive polymer layer or a nitride-based photosensitive polymer layer. Accordingly, a conventional process of removing a photoresist pattern can be omitted. Omission of the removing process of the photoresist pattern can contribute to process simplicity and yield improvement. That is, production efficiency of the image sensing device 75 can be significantly improved compared to the conventional art.

Consequently, the image sensing device 75 having the protection pattern 73' can be manufactured. The protection pattern 73' can serve to prevent physical damage of the microlenses 71. Also, it is significantly more difficult for contaminants to become adhered to the surface of the protection pattern 73'. Furthermore, even when the contaminants are adhered to the surface of the protection pattern 73', the contaminants can be easily removed.

An exemplary embodiment where the image sensing device is a CMOS image sensor (CIS) was explained above. However, the present invention need not be limited to the embodiments described above. For example, the present invention can be applied to another image sensing device, such as a charge coupled device (CCD), a camera module employing the same, and a method of making the same.

According to the present invention as described above, a protection pattern covering microlenses is provided. The protection pattern can be formed of an oxide-based photosensitive polymer layer or a nitride-based photosensitive polymer layer. Also, the protection pattern can have excellent transmittance and a substantially flat top surface. The protection pattern can serve to prevent damage of the microlenses and contamination of surfaces of the microlenses. Consequently, an image sensing device, which can prevent the physical damage of the microlenses and adherence of the contaminants, can be implemented.

Moreover, the protection pattern can be formed of the photosensitive polymer layer. Accordingly, a conventional process of removing a photoresist pattern can be omitted. That is, the image sensing device having a protection pattern on microlenses can be formed by a relatively simple process compared to the prior art.

Furthermore, a camera module having the image sensing device can be implemented. In this case, the camera module can have high production efficiency and excellent reliability owing to the protection pattern.

Exemplary embodiments in accordance with the present invention have been disclosed herein and, although specific terms are employed, they are used and are to be interpreted in a generic and descriptive sense only and not for purpose of limitation. Accordingly, it will be understood by those of ordinary skill in the art that various changes in form and details can be made without departing from the spirit and scope of the present invention as set forth in the following claims. It is intended by the following claims to claim that which is literally described and all equivalents thereto, including all modifications and variations that fall within the scope of each claim.

What is claimed is:

1. A method of forming an image sensing device, comprising:
   forming a plurality of photodiodes in a semiconductor substrate;
   forming at least one insulating layer with a substantially flat top surface on the photodiodes;
   forming a plurality of microlenses on the at least one insulating layer, each of the microlenses being arranged over a corresponding one of the photodiodes; and
   forming a protection pattern covering the microlenses, including forming on the semiconductor substrate having the microlenses a protection layer from an oxide-based photosensitive polymer layer or a nitride-based photosensitive polymer layer.

2. The method according to claim 1, wherein forming the protection pattern comprises:
   patterning the protection layer using exposure and development.

3. The method according to claim 1, wherein the protection layer is formed of a material layer having a transmittance of about 80% to 99.9%.

4. The method according to claim 1, wherein the protection pattern is formed to have a substantially flat top surface.

5. The method according to claim 1, wherein forming the at least one insulating layer comprises:
   forming a lower insulating layer on the semiconductor substrate having the photodiodes; and
   forming an upper insulating layer on the lower insulating layer.

6. The method according to claim 5, further comprising:
   forming interconnections and a bond pad on the lower insulating layer; and
   forming a plurality of color filters within the upper insulating layer.

7. The method according to claim 6, further comprising:
   etching the upper insulating layer until the bond pad is exposed using the protection pattern as an etch mask.

8. The method according to claim 5, wherein forming the upper insulating layer comprises forming a resin layer on the lower insulating layer.

9. A method of forming an image sensing device, comprising:
   forming a plurality of photodiodes in a semiconductor substrate;
   forming an insulating layer on the semiconductor substrate and a bond pad in the insulating layer;
   forming a plurality of microlenses on the insulating layer, each of the microlenses being arranged over a corresponding one of the photodiodes;
   forming a protection pattern covering the microlenses, wherein the protection pattern is formed of an oxide-based photosensitive polymer layer or a nitride-based photosensitive polymer layer, wherein the protection pattern includes an opening exposing the insulating layer over the bond pad, and wherein a surface of the protection pattern is exposed; and
   etching the insulating layer until the bond pad is exposed using the protection pattern as an etch mask.

10. An image sensing device, comprising:
   a plurality of photodiodes provided on a semiconductor substrate;
   at least one insulating layer disposed in the photodiodes and having a substantially flat top surface;
   a plurality of microlenses provided on the insulating layer, each microlens disposed over a corresponding one of the photodiodes; and
   a protection pattern covering the microlenses, wherein the protection pattern is formed of an oxide-based photosensitive polymer layer or a nitride-based photosensitive polymer layer.

11. The device according to claim 10, wherein the protection pattern has a substantially flat top surface.

12. The device according to claim 10, wherein the protection pattern has a transmittance of about 80% to 99.9%.

13. The device according to claim 10, further comprising:
   a plurality of color filters provided within the at least one insulating layer, wherein the color filters are disposed between the photodiodes and the microlenses.

14. The device according to claim 10, further comprising:
   interconnections disposed in the at least one insulating layer, wherein the interconnections are disposed to not cover the photodiodes and the interconnections are electrically connected to the photodiodes.

15. The device according to claim 10, wherein the at least one insulating layer comprises a resin layer.

16. The device according to claim 10, further comprising:
   a bond pad disposed on the semiconductor substrate, wherein the protection pattern includes an opening disposed over the bond pad, wherein the insulating layer includes a pad window exposing the bond pad, and wherein the pad window is self-aligned with the opening.

* * * * *